United States Patent
Jewram et al.

(10) Patent No.: US 7,760,507 B2
(45) Date of Patent: Jul. 20, 2010

(54) THERMALLY AND ELECTRICALLY CONDUCTIVE INTERCONNECT STRUCTURES

(75) Inventors: Radesh Jewram, Lakeville, MN (US); Sanjay Misra, Shoreview, MN (US)

(73) Assignee: The Bergquist Company, Chanhassen, MN (US)

( * ) Notice: Subject to any disclaimer, the term of this patent is extended or adjusted under 35 U.S.C. 154(b) by 223 days.

(21) Appl. No.: 11/964,197

(22) Filed: Dec. 26, 2007

(65) Prior Publication Data

US 2009/0168354 A1 Jul. 2, 2009

(51) Int. Cl.
*H05K 7/20* (2006.01)

(52) U.S. Cl. .................. 361/713; 361/709; 361/712; 174/548

(58) Field of Classification Search .......... 361/709, 361/712, 713; 174/126.1, 548
See application file for complete search history.

(56) References Cited

U.S. PATENT DOCUMENTS

| | | | |
|---|---|---|---|
| 4,283,464 A | 8/1981 | Hascoe | |
| 4,415,025 A | 11/1983 | Horvath | |
| 4,782,893 A | 11/1988 | Thomas | |
| 5,019,941 A | 5/1991 | Craft | |
| 5,050,040 A * | 9/1991 | Gondusky et al. | 361/708 |
| 5,132,776 A | 7/1992 | Hanada et al. | |
| 5,159,531 A | 10/1992 | Horvath et al. | |
| 5,224,030 A | 6/1993 | Banks et al. | |
| 5,270,902 A | 12/1993 | Bellar et al. | |
| 5,316,080 A | 5/1994 | Banks et al. | |
| 5,494,753 A | 2/1996 | Anthony | |
| 5,646,373 A | 7/1997 | Collins et al. | |
| 5,660,917 A | 8/1997 | Fujimori et al. | |
| 5,783,862 A | 7/1998 | Deeney | |
| 5,886,407 A | 3/1999 | Polese et al. | |
| 5,898,573 A | 4/1999 | Fugaro | |
| 5,958,572 A | 9/1999 | Schmidt et al. | |
| 6,064,573 A | 5/2000 | Morton | |
| 6,081,039 A | 6/2000 | Furnival | |

(Continued)

FOREIGN PATENT DOCUMENTS

DE 3825981 2/1990

(Continued)

OTHER PUBLICATIONS

"Aligned carbon nanotube composite films for thermal management", Huang Hua et al., Adv. Mater. (Weinheim, Ger.), vol. 17, Issue: 13, pp. 1652-1656, 2005.

(Continued)

*Primary Examiner*—Anatoly Vortman
(74) *Attorney, Agent, or Firm*—Haugen Law Firm PLLP

(57) ABSTRACT

An interconnect structure for operable placement between a first body and a second body, wherein the interconnect structure includes a first surface for operable juxtaposition with the first body, a second surface for operable juxtaposition with the second body, and a thickness dimension defined between the first and second surfaces. The interconnect structure includes a first thermally conductive material and a second electrically conductive material, wherein the second electrically conductive material is formed in one or more distinct structures, with the structures forming at least one substantially continuous pathway of the second material through the thickness dimension. The interconnect structure exhibits a compressive modulus along a thickness axis of less than about 100 psi.

20 Claims, 2 Drawing Sheets

U.S. PATENT DOCUMENTS

| | | | |
|---|---|---|---|
| 6,165,612 A * | 12/2000 | Misra | 428/344 |
| 6,197,859 B1 * | 3/2001 | Green et al. | 524/270 |
| 6,234,842 B1 | 5/2001 | Keay et al. | |
| 6,246,583 B1 | 6/2001 | Cronin et al. | |
| 6,372,997 B1 | 4/2002 | Hill et al. | |
| 6,407,922 B1 | 6/2002 | Eckblad et al. | |
| 6,411,513 B1 | 6/2002 | Bedard | |
| 6,424,531 B1 | 7/2002 | Bhatti et al. | |
| 6,498,726 B2 | 12/2002 | Fuller et al. | |
| 6,680,015 B2 | 1/2004 | McCullough | |
| 6,702,587 B2 | 3/2004 | Weiss et al. | |
| 6,727,422 B2 | 4/2004 | Macris | |
| 6,773,532 B2 | 8/2004 | Wolf et al. | |
| 6,780,374 B2 | 8/2004 | Weaver et al. | |
| 6,831,359 B2 | 12/2004 | Heilbronner | |
| 6,867,978 B2 * | 3/2005 | Whittenburg et al. | 361/719 |
| 6,873,043 B2 | 3/2005 | Oman | |
| 6,898,084 B2 * | 5/2005 | Misra | 361/710 |
| 6,940,724 B2 | 9/2005 | Divakar et al. | |
| 6,947,285 B2 * | 9/2005 | Chen et al. | 361/708 |
| 6,950,309 B2 | 9/2005 | Petrella et al. | |
| 7,001,217 B2 | 2/2006 | Bright et al. | |
| 7,014,093 B2 * | 3/2006 | Houle et al. | 228/56.3 |
| 7,038,009 B2 | 5/2006 | Sagal et al. | |
| 7,078,109 B2 * | 7/2006 | Hill et al. | 428/620 |
| 7,083,850 B2 | 8/2006 | Rasiah | |
| 7,093,958 B2 | 8/2006 | Coushaine | |
| 7,132,746 B2 * | 11/2006 | Brandenburg et al. | 257/713 |
| 7,183,641 B2 * | 2/2007 | Renavikar et al. | 257/713 |
| 7,190,585 B2 * | 3/2007 | Houle | 361/704 |
| 7,252,877 B2 * | 8/2007 | Jayaraman et al. | 428/323 |
| 7,477,519 B2 * | 1/2009 | Kubo | 361/719 |
| 7,485,495 B2 * | 2/2009 | Renavikar et al. | 438/122 |
| 2002/0015288 A1 | 2/2002 | Dibene, II et al. | |
| 2002/0023732 A1 | 2/2002 | Graf et al. | |
| 2002/0023733 A1 | 2/2002 | Hall et al. | |
| 2002/0096428 A1 * | 7/2002 | Scott et al. | 204/298.12 |
| 2002/0195229 A1 | 12/2002 | Hsieh et al. | |
| 2003/0027910 A1 * | 2/2003 | Misra et al. | 524/404 |
| 2003/0117770 A1 * | 6/2003 | Montgomery et al. | 361/687 |
| 2003/0117775 A1 * | 6/2003 | Vrtis et al. | 361/705 |
| 2003/0146266 A1 | 8/2003 | Chaudhuri et al. | |
| 2003/0150604 A1 * | 8/2003 | Koning et al. | 165/185 |
| 2003/0187116 A1 * | 10/2003 | Misra et al. | 524/404 |
| 2004/0036161 A1 | 2/2004 | Williams et al. | |
| 2004/0037044 A1 | 2/2004 | Cook et al. | |
| 2004/0048050 A1 | 3/2004 | Cassat et al. | |
| 2004/0095727 A1 * | 5/2004 | Houle | 361/704 |
| 2005/0049350 A1 * | 3/2005 | Tonapi et al. | 524/492 |
| 2005/0057908 A1 | 3/2005 | Egitto et al. | |
| 2005/0064204 A1 | 3/2005 | Lalli et al. | |
| 2006/0097382 A1 | 5/2006 | Mori et al. | |
| 2006/0122304 A1 * | 6/2006 | Matayabas, Jr. | 524/430 |
| 2007/0231560 A1 * | 10/2007 | Zhang et al. | 428/323 |
| 2007/0251639 A1 * | 11/2007 | Jayaraman et al. | 156/283 |
| 2008/0067669 A1 * | 3/2008 | Buttel | 257/706 |

FOREIGN PATENT DOCUMENTS

| | | |
|---|---|---|
| EP | 0 790 762 | 8/1997 |
| EP | 1 583 146 | 10/2005 |
| JP | 02256260 | 10/1990 |
| JP | 04099051 | 3/1992 |
| WO | WO 2005/024942 | 3/2005 |
| WO | WO 2005/057674 | 6/2005 |

OTHER PUBLICATIONS

"Thermal behaviour of electric connector coating irradiated by a laser beam", Semmar, N et al., Microelectronic Journal, 2002, vol. 33, No. 9, pp. 705-710.

"Integrated micro thermoelectric cooler: Theory, fabrication and characterization" de Silva et al., Dissertation of Abstracts International, 2005, vol. 66/02-B, p. 1125.

"Electrically conductive and thermally conductive materials for electronic packaging", Liu, Dissertation of Abstracts International, Feb. 1, 2005, vol. 65/12-B, p. 6560.

"Study of thermally reworkable epoxy materials and thermal conductivity enhancement using carbon fiber for electronics packaging", Li, Dissertation of Abstracts International, Nov. 2003, vol. 64/10, p. 5160.

"Evaluating thermal and mechanical properties of electrically conductive adhesives for electronic applications," Xu, Dissertation of Abstracts International, Apr. 2001, vol. 63/03-B, p. 1522.

\* cited by examiner

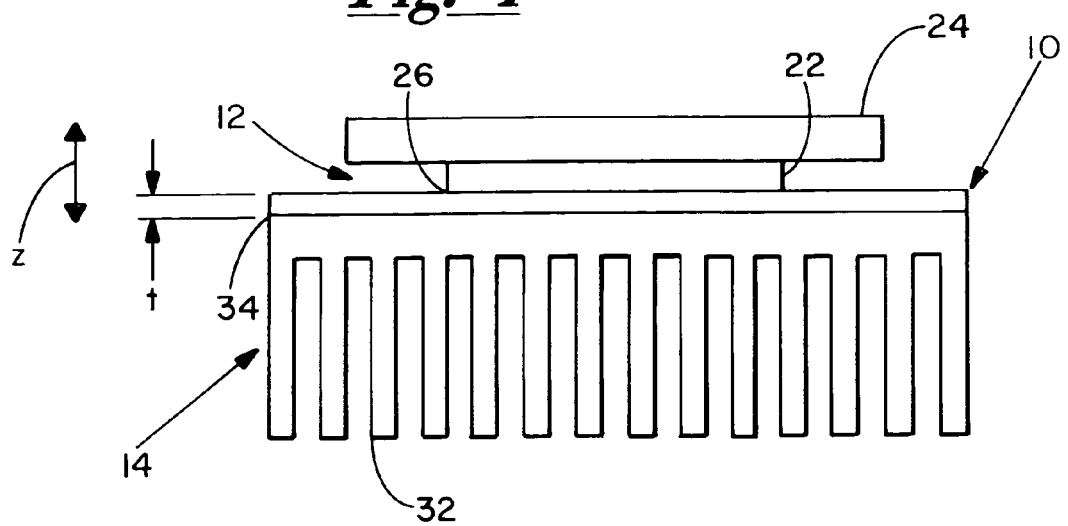
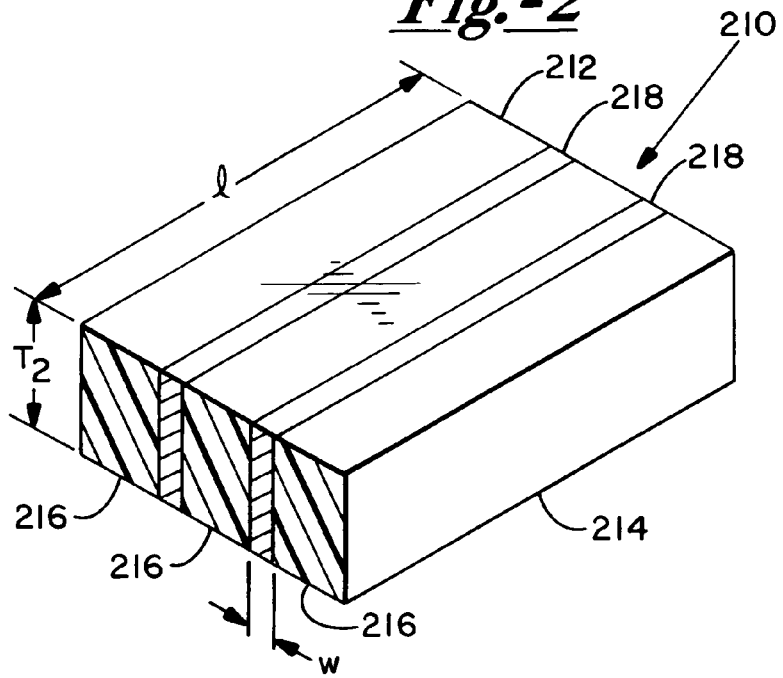

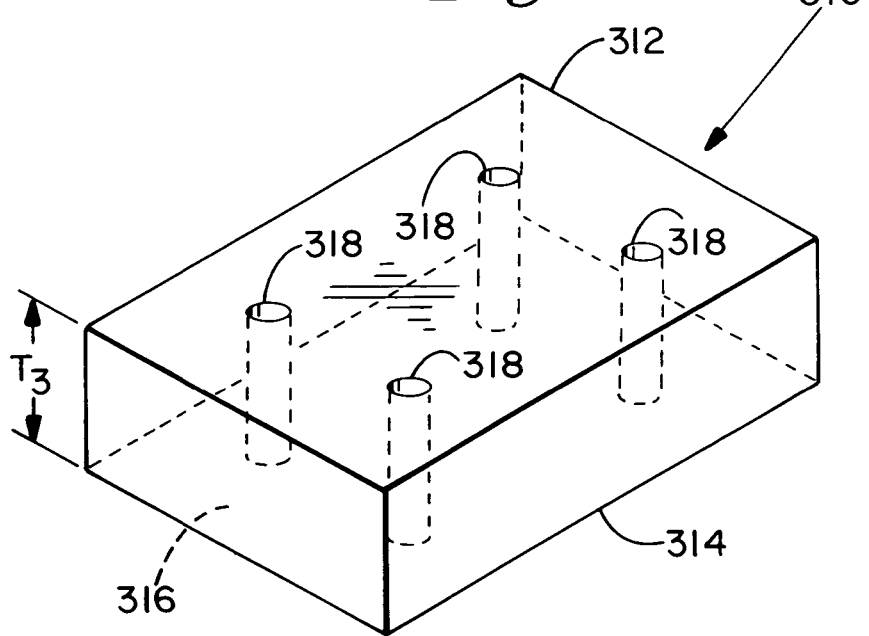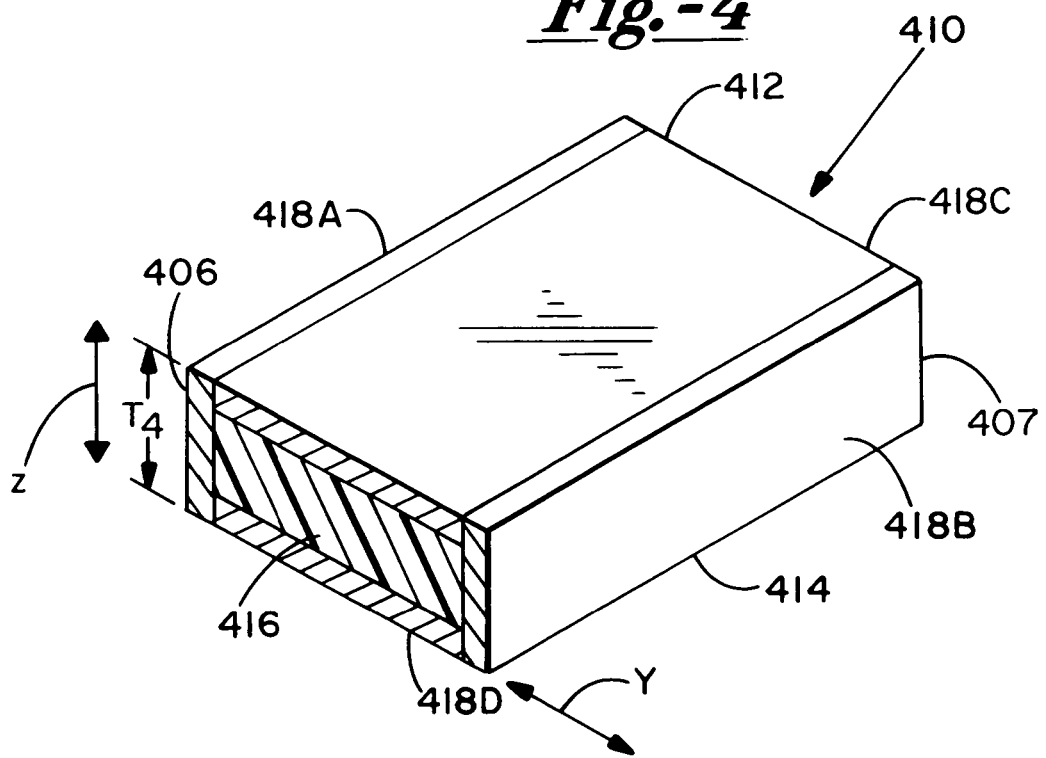

THERMALLY AND ELECTRICALLY CONDUCTIVE INTERCONNECT STRUCTURES

FIELD OF THE INVENTION

The present invention relates to interface materials and structures for use in connection with electronic components, and more particularly to interconnect structures for use in connection with heat-generating electronic devices, such as printed circuit boards (PCBs), integrated circuits (ICs), central processing units (CPUs), and the like, and in coupling such heat-generating electronic devices to separate bodies such as heat dissipaters.

BACKGROUND OF THE INVENTION

Thermal interface materials and structures have found increasing usage as the demands for thermal dissipation from heat-generating electronic devices have correspondingly increased. As electronic components used in the manufacture of various products have become both smaller in size and greater in capacity, their heat generation per unit area has increased dramatically. Because many electronic components lose efficiency and performance in elevated temperature environments, it has become imperative to utilize materials and structures proficient in removing thermal energy from and around the respective heat-generating electronic components.

In many applications, a heat diffuser, such as a heat sink or heat spreader, is employed to increase the rate at which thermal energy is removed from a heat-generating electronic component. Such heat diffusers are thermally conductive, and typically provide a heat exchange interface of relatively high capacity. For example, heat spreaders may be thermally coupled to a heat-generating electronic component and placed in the path of a moving air stream driven by a cooling fan, or may be in thermal contact with another fluid of even greater thermal capacity, such as water, in order to shed thermal energy to the thermal loading fluid. In some iterations, the heat spreaders possess relatively large surface areas to increase the potential contact area with a thermal loading fluid, as described above.

One problem that is encountered in removing thermal energy through the use of a heat dissipater is in obtaining good thermal coupling between the heat-generating electronic component and the heat dissipater. For example, respective facing surfaces of the heat-generating electronic component and the heat dissipater may be irregular, thereby preventing continuous contact therebetween. Where contact between the two facing surfaces is not obtained, heat transfer efficiency is dramatically reduced due to the fact that an additional thermal boundary in the form of a gap between the two facing surfaces is introduced, and wherein the gap likely has a lower thermal conductivity than the material of the heat dissipater.

Various solutions have been implemented in an attempt to overcome such problem, including the use of thermally conductive interface materials disposed between the heat-generating electronic component and the heat dissipater to minimize or eliminate gaps between the component and the heat dissipater. Thermal interface materials have been rendered in various forms, such as greases, waxes, pastes, gels, pads, adhesives, and the like. Conventional thermal interface materials typically contain a polymer substance that, in its bulk form, is at least somewhat conformable to a surface when placed under applied pressure and potentially within an elevated temperature environment. In some applications, such a conformable substance may be silicone oil or other polymer material. The conformability aspect of thermal interface materials is important in order to fill in any surfaces irregularities in the respective heat transfer surfaces so as to maximize the efficiency of thermal transfer from the heat-generating electronic component to the thermal interface material, and subsequently from the thermal interface material to the heat dissipater. Any gaps that may exist between the thermal interface material and the respective surfaces of the heat-generating electronic component and the heat dissipater introduce additional thermal boundaries, which reduce thermal transfer rates.

Though various thermal interface materials and structures have been developed for the purpose of removing thermal energy from heat-generating electronic components, it has been discovered that interface materials and structures may additionally be useful in acting as an electrical conductor between two bodies. Many electrically conductive connection apparati, of course, are found in the conventional arts. However, such apparatus are typically insufficiently conformable, and insufficiently thermally conductive to provide desired thermal conductivity and thermal transfer characteristics.

It is therefore a principal object of the present invention to provide an interconnect structure that is thermally and electrically conductive, and is also sufficiently conformable so as to be useful as a thermal and electrical interconnect.

It is a further object of the present invention to provide an interconnect structure that exceeds at least a minimum threshold for thermal and electrical conductivity at least along a designated direction, which direction connects a first body to a second body.

It is another object of the present invention to provide a thermally and electrically conductive interconnect structure for disposition between a first body and second body, which interconnect structure exhibits sufficient conformability so as to enable desired efficiency of thermal and electrical energy transfer between the first and second bodies.

SUMMARY OF THE INVENTION

By means of the present invention, thermal and electrical energy may be effectively transmitted through an interface between two bodies. The transmittance of thermal and electrical energy is facilitated through an interconnect structure that is arranged and sufficiently conformable so as to enable desired efficiency of thermal and electrical energy transfer between the two bodies. The interconnect structure may therefore be useful in a variety of applications, including connections of heat-generating electronic components to respective heat dissipaters.

In one embodiment, the interconnect structure of the present invention includes a first surface for operable juxtaposition with a first body and a second surface for operable juxtaposition with a second body, and wherein a thickness dimension of the interconnect structure is defined between the first and second surfaces. The interconnect structure includes a first material having a thermal conductivity of at least about 0.5 W/m·K, and a second material having an electrical resistance of less than about 10,000 ohms. The second material is formed in one or more distinct structures, with the structures forming at least one substantially continuous pathway of the second material through the thickness dimension. The interconnect structure has a compressive modulus along the thickness axis of less than about 100 psi.

In some embodiments, the first material may be a polymer matrix, and may be filled with between about 5% and about 95% by weight thermally conductive particulate. At least a portion of the first material may be disposed continuously through the thickness dimension of the interconnect structure.

In some embodiments, a plurality of the structures may be provided in the interconnect structure, wherein each of said structures extend continuously through the thickness dimension. The structures may also be substantially parallel to one another and separated by the first material.

A method for transferring thermal and electrical energy from a first body to a second body may include providing an interconnect structure having a first surface, a second surface, and a thickness dimension defined between the first and second surfaces. The first material of the interconnect structure may have a thermal conductivity of at least about 0.5 W/m·K, and a second material having an electrical resistance of less than about 10,000 ohms. The second material may be formed in one or more distinct structures, with the structures forming at least one substantially continuous pathway of the second material through the thickness dimension. The interconnect structure preferably further exhibits a compressive modulus along a thickness axis of less than about 100 psi. The method for transferring thermal and electrical energy further includes positioning the interconnect structure between the first and second bodies, such that the first surface is in thermal and electrical contact with the first body, and the second surface is in thermal and electrical contact with the second body.

BRIEF DESCRIPTION OF THE DRAWINGS

FIG. 1 is a side elevational view of an electronic component arrangement incorporating an interconnect structure;

FIG. 2 is a perspective view of an interconnect structure;

FIG. 3 is a perspective view of an interconnect structure; and

FIG. 4 is a perspective view of an interconnect structure.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

With reference now to the drawing figures, and first to FIG. 1, an electronic component arrangement is illustrated with an interconnect structure 10 disposed between a heat-generating electronic component 12 and a heat diffuser 14. By way of example, electronic component 12 may be a central processing unit 22 disposed on a substrate 24, wherein heat diffuser 14 is provided to withdraw excess thermal energy generated by processor 22. In some embodiments, heat dissipater 14 may be a heat sink or heat spreader that includes a plurality of fins 32 for dissipating thermal energy to air and/or another fluid in contact therewith. Fins 32 significantly increase the surface area of potential conductive heat transfer to the fluid media.

The arrangement illustrated in FIG. 1 demonstrates interconnect structure 10 as an interface between electronic component 12 and heat dissipater 14. To maximize effectiveness as an interface in enabling energy transport thereacross, interconnect structure 10 may be in conductive contact with surface 26 of processor 22, and with surface 34 of heat dissipater 14.

Interconnect structure 10 may be provided in a variety of configurations, so long as interconnect structure 10 exhibits both thermal and electrical conductivity through its thickness dimension "t" at least along a first direction "z" in parallel with thickness dimension "t". Example arrangements for interconnect structure 10 are illustrated in FIGS. 2-4, with such interconnect structures being identified by reference numerals 210, 310, and 410, respectively.

With reference to the embodiment shown in FIG. 2, interconnect structure 210 includes a first surface 212 and a generally opposed second surface 214. A thickness dimension "$t_2$" of interconnect structure 210 is defined between first and second surfaces 212, 214. Though thickness dimension "$t_2$" of the interconnect structures of the present invention may vary greatly, such thickness dimensions "t" are typically on the order of between about 1 and about 20 mils and in some cases between about 5 and about 10 mils. The thickness dimension "t" of the interconnect structures, however, may be assigned as desired or as needed to fulfill the particular requirements of an application.

In the embodiment illustrated in FIG. 2, interconnect structure 210 includes a first thermally conductive material 216 and electrically conductive structures 218. Thermally conductive material 216 may be, as described above, one or more of various pastes, waxes, gels, greases, oils, adhesives, and the like which can act as a conformable interface to respective surfaces, such as surface 34 of heat dissipater 14 and surface 26 of component 12. In some embodiments, the pastes, waxes, gels, greases, oils, adhesives, and the like are thermally conductive in at least a "z" direction. It is desired that the thermal conductivity in at least a "z" direction of thermally conductive material 216 is at least 0.5 W/m·K.

Thermally conductive material 216 may include a polymer compound, such as elastomers including silicone, natural or synthetic rubber, acrylic, urethanes, and thermoplastic rubbers, as well as glassy materials including epoxies, phenolics, and the like. The polymeric compounds may be a substantially fully cross-linked structure or "B-staged", including those which can be cross-linked subsequent to placement at the interface position through, for example, thermal or radiative activation. Accordingly, thermally conductive material 216 may be provided as fully cured substances in the form of self-supporting films or pads, or may be provided in dispensable form, whether substantially fully cured, or "B-staged" requiring further curing. Thermally conductive material 216 may also be "phase-changing", by being form-stable at room temperature, but somewhat liquidous at operating temperatures of, for example, processor 22. Thermally conductive material 216 may include polymers based on silicones or on other polymers, including thermoplastic or thermosetting polymers.

In some embodiments, a thermally conductive filler material may be included in thermally conductive material 216 in order to enhance the thermal conductivity and/or rheology characteristics of thermally conductive material 216. Example thermally conductive filler materials include alumina, aluminum nitride, boron nitride, zinc oxide, graphite, metal alloys, and the like. Certain of the filler materials may be considered "particulate", including various solid or hollow bodies of uniform or non-uniform shape, size, size distribution, or density. While various particle size distributions may be useful in filler materials of thermally conductive material 216, it has been found that a mean particle size of between about 1 and about 200 micrometers provides a useful size distribution. Such filler may have a loading concentration in thermally conductive material 216 at between about 5% and about 95% by weight, wherein higher loading concentrations of the thermally conductive filler typically increases the overall thermal conductivity and viscosity of thermally conductive material 216. As a result, a balance is typically struck between a desired level of thermal conductivity and the physical workability of the bulk material based on its viscosity.

A variety of commercially-available products may be useful as thermally conductive material 216, including, for example, silicone or silicone free Gap Pads® available from the Bergquist Company of Chanhassen, Minn.

In the embodiment illustrated in FIG. 2, thermally conductive material 216 is provided as portions separated by electrically conductive structures 218, or, alternatively as portions separating electrically conductive structures 218. Thermally conductive material 216 may, as illustrated in FIG. 2, be disposed in one or more portions extending continuously through thickness dimension "$t_2$", wherein a continuous path of thermally conductive material 216 extends from first surface 212 to second surface 214 of interconnect structure 210. Such continuous paths of thermally conductive material 216 aid in providing continuous thermal conduction pathways between electronic component 12 and heat dissipater 14 through thickness dimension "$t_2$" of interconnect structure 210. In effect, the continuous pathways of thermally conductive material 216 through thickness dimension "t" provides a low thermal resistance pathway to enable efficient heat transfer away from electronic component 12.

Electrically conductive structures 218 are preferably fabricated from a material having an electrical resistance of less than about 10,000 ohms. Example materials for electrically conductive structures 218 include copper, aluminum, oriented graphite, diamond, metal alloys, and the like. Preferably, electrically conductive structures 218 form at least one substantially continuous pathway of electrically conductive material through thickness dimension "$t_2$" of interconnect structure 210. In some embodiments, at least one electrically conductive structure 218 itself provides a continuous electrically conductive pathway through thickness dimension "$t_2$" of interconnect structure 210. Good electrical conductivity from first surface 212 to second surface 214 of interconnect structure 210 may be desired in applications such as high frequency ASIC with grounding pads to eliminate electromagnetic interference.

In the embodiment illustrated in FIG. 2, electrically conductive structures 218 are in the form of substantially planar sheets or plates each extending through an entire thickness dimension "$t_2$" and an entire length dimension "l" of interconnect structure 210. Such structures 218, however, need not all extend through an entire thickness dimension "$t_2$" and/or through an entire length dimension "l" of interconnect structure 210. For example, one or more of structures 218 may extend only partially through a thickness dimension "$t_2$" or through a length dimension "l", wherein such structures 218 may be selectively positioned within interconnect structure 210. In some embodiments, however, electrically conductive structures 218 may be oriented substantially along the "z" direction so as to aid in transmitting electrical energy from first surface 212 to second surface 214, or vice versa. Electrically conductive structures 218 may be in the form of, for example, foil layers having thickness dimensions "w" of between about 6 and about 250 micrometers.

An important physical characteristic for the interconnect structures of the present invention, such as interconnect structure 210, is the conformability of first and second surfaces 212, 214, to respective body surfaces, such as surface 26 of component 12 and surface 34 of heat dissipater 14. One measure of conformability of a body is the compressive modulus, wherein the interconnect structures of the present invention preferably exhibit a compressive modulus along a "z" direction of less than about 100 pounds per square inch. In order to attain the desired compressive modulus, therefore, thermally conductive material 216 and electrically conductive structures 218 may be selected for their respective physical properties and configurations. Electrically conductive structures 218 may, for example, be relatively thin so as to be relatively easily compressible in at least the "z" direction. By way of example, a copper foil material for electrically conductive structures 218 may be provided with a thickness dimension "w" of between about 6 and about 250 micrometers. Applicants have determined that such a foil configuration in, for example, copper material, enables a desired compressive modulus for interconnect structure 210. Moreover, thermally conductive material 216 is also preferably formed of a relatively compressible material, such as a polymer matrix, as described above.

Interconnect structure 310 is illustrated in FIG. 3 as having a first surface 312, a generally opposing second surface 314, and a thickness dimension "$t_3$" defined therebetween. Interconnect structure 310 includes a first thermally conductive material 316 and electrically conductive structures 318. Thermally conductive material 316 may be similar to that described above with reference to thermally conductive material 216. At least a portion of thermally conductive material 316 may extend continuously between first surface 312 and second surface 314 through thickness dimension "$t_3$".

Electrically conductive structures 318 may be in the form of rods or posts having a cross-sectional dimension "x" of between about 6 and 250 micrometers. Such electrically conductive structures 318 may each have a substantially identical cross-sectional dimension "x", or may have different cross-sectional dimensions. Preferably, at least one substantially continuous pathway of electrical conductive material extends through thickness dimension "$t_3$" of interconnect structure 310. For example, at least one electrically conductive structure 318 may extend continuously through thickness dimension "$t_3$". Some of such electrically conductive structures 318, however, may not fully extend through a thickness dimension "$t_3$" of interconnect structure 310. Electrically conductive structures 318 may be of any desired cross-sectional shape, and may be aligned in any of a variety of orientations within interconnect structure 310. In some embodiments, at least one of electrically conductive structures 318 extend substantially perpendicularly with respect to first surface 312, so as to create a minimum length electrically conductive pathway between electrically coupled first and second bodies, such as between electrical component 12 and heat dissipater 14. In some arrangements, however, orientations for electrically conductive structures 318 other than perpendicular to first surface 312 may result in a minimum length electrically conductive pathway between first surface 312 and second surface 314. Accordingly, orientations for electrically conductive structures 318 may be assigned as desired per application. As described above with reference to electrically conductive structures 218, structures 318 preferably exhibit an electrical resistance of less than about 10,000 ohms, and may be fabricated from a variety of electrically conductive materials.

A further arrangement is illustrated in FIG. 4, wherein interconnect structure 410 includes electrically conductive structures 418 at least partially encapsulating thermally conductive material 416. In the embodiment illustrated in FIG. 4, a plurality of electrically conductive structures 418 may be provided as described with reference to FIG. 2 in the form of plates or sheets in various orientations. In one embodiment, structures 418A and 418B are oriented along the "z" direction and extend between first surface 412 and second surface 414 of interconnect structure 410, while being disposed at generally opposed sides 406, 407 of interconnect structure 410.

Electrically conductive structures 418C, 418D are oriented along a "y" direction, and extending between electrically conductive structures 418A and 418B to substantially surround thermally conductive material 416. Other arrangements, of course, for electrically conductive structures 418A-D may be provided. For example, electrically conductive structures 418C, 418D may extend to opposed sides 406, 407, while electrically conductive structures 418A, 418B extend between structures 418C, 418D. In this manner, at least one continuous pathway of electrically conductive material through a thickness dimension "$t_4$" is formed through the combination of structures 418C to 418A to 418D or from 418C to 418B to 418D, or vice versa.

The arrangements described herein are merely exemplary of the myriad of configurations envisioned by the present invention. In effect, Applicants contemplate various configurations which enable thermal and electrical conductivity through a thickness dimension of an interconnect structure, which may be disposed between two bodies. In order to effectuate the purposes of the invention, Applicants contemplate that the interconnect structures are limited only by the concept of having a first thermally conductive material which exhibits a thermal conductivity of greater than about 0.5 W/m·K, a second electrically conductive material having an electrical resistance of less than about 10,000 ohms, and an overall conformability characteristic of the interconnect structure that is defined by a compressive modulus in the "z" direction of less than about 100 psi. It may be desired that the electrically conductive material is formed in one or more distinct structures, which form at least one substantially continuous pathway of the electrically conductive material through a thickness dimension of the interconnect structure.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. An interconnect structure for operable placement between a first body and a second body, said interconnect structure comprising:
    (a) a first surface for operable juxtaposition with said first body;
    (b) a second surface for operable juxtaposition with said second body;
    (c) a thickness dimension defined along a thickness direction between said first and second surfaces;
    (d) a first material having a thermal conductivity of at least about 0.5 W/m·K; and
    (e) a second material having an electrical resistance of less than about 10,000 ohms, said second material being formed in one or more distinct structures, with said structures forming at least one substantially continuous pathway of said second material through said thickness dimension, said first material and said structures forming said interconnect structure each having a compressive modulus along said thickness direction of less than about 100 psi.

2. An interconnect structure as in claim 1 wherein said first body is a heat-generating element.

3. An interconnect structure as in claim 1 wherein said second body is a heat sink.

4. An interconnect structure as in claim 1 wherein said first material is a polymer matrix.

5. An interconnect structure as in claim 4 wherein said polymer matrix is filled with between about 5% and about 95% by weight thermally conductive particulate.

6. An interconnect structure as in claim 5 wherein said thermally conductive particulate is selected from the group consisting of alumina, alumina nitride, boron nitride, graphite, and combinations thereof.

7. An interconnect structure as in claim 5 wherein said thermally conductive particulate has a mean particle size range of between about 1 and 200 μm.

8. An interconnect structure as in claim 1 wherein at least a portion of said first material is disposed continuously through said thickness dimension.

9. An interconnect structure as in claim 1, including a plurality of said structures each extending continuously through said thickness dimension.

10. An interconnect structure as in claim 9 wherein said structures are substantially parallel to one another, and are mutually spaced-apart from one another.

11. An interconnect structure as in claim 10 wherein said first material separates said structures.

12. A method for transferring thermal and electrical energy from a first body to a second body, said method comprising:
    (a) providing an interconnect structure having:
        (i) a first surface, a second surface, and a thickness dimension defined along a thickness direction between said first and second surfaces;
        (ii) a first material having a thermal conductivity of at least about 0.5 W/m·K; and
        (iii) a second material having an electrical resistance of less than about 10,000 ohms, said second material being formed in one or more distinct structures, with said structures forming at least one substantially continuous pathway of said second material through said thickness dimension, said first material and said structures forming said interconnect structure each having a compressive modulus along said thickness direction of less than about 100 psi; and
    (b) positioning said interconnect structure between said first and second bodies, such that said first surface is in thermal and electrical contact with said first body, and said second surface is in thermal and electrical contact with said second body.

13. A method as in claim 11 wherein first body is a heat-generating element.

14. A method as in claim 12 wherein said second body is a heat sink.

15. A method as in claim 12 wherein said first material is a polymer matrix.

16. A method as in claim 15 wherein said polymer matrix is filled with between about 5% and about 95% by weight thermally conductive particulate.

17. A method as in claim 12 wherein at least a portion of said first material is disposed continuously through said thickness dimension.

18. A method as in claim 12, including a plurality of said structures each extending continuously through said thickness dimension.

19. A method as in claim 18 wherein said structures are substantially parallel to one another.

20. A method as in claim 19 wherein said first material separates said structures.

* * * * *